(12) United States Patent
Senzaki

(10) Patent No.: US 9,810,986 B2
(45) Date of Patent: Nov. 7, 2017

(54) METHOD FOR PRODUCING A FIBER HAVING A PATTERN ON A SURFACE THEREOF

(71) Applicant: TOKYO OHKA KOGYO CO., LTD., Kawasaki-shi (JP)

(72) Inventor: Takahiro Senzaki, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 0 days.

(21) Appl. No.: 15/170,027

(22) Filed: Jun. 1, 2016

(65) Prior Publication Data
US 2016/0355953 A1 Dec. 8, 2016

(30) Foreign Application Priority Data
Jun. 4, 2015 (JP) ................. 2015-113713

(51) Int. Cl.
| | | |
|---|---|---|
| *G03F 7/004* | (2006.01) | |
| *G03F 7/40* | (2006.01) | |
| *G03F 7/16* | (2006.01) | |
| *G03F 7/038* | (2006.01) | |
| *G03F 7/00* | (2006.01) | |
| *B82Y 40/00* | (2011.01) | |
| *B82Y 10/00* | (2011.01) | |
| *H01L 21/027* | (2006.01) | |
| *G03F 7/32* | (2006.01) | |
| *D01D 5/253* | (2006.01) | |

(52) U.S. Cl.
CPC .............. *G03F 7/165* (2013.01); *B82Y 10/00* (2013.01); *B82Y 40/00* (2013.01); *D01D 5/253* (2013.01); *G03F 7/002* (2013.01); *G03F 7/038* (2013.01); *G03F 7/16* (2013.01); *G03F 7/168* (2013.01); *G03F 7/32* (2013.01); *G03F 7/40* (2013.01); *H01L 21/0274* (2013.01)

(58) Field of Classification Search
CPC . G03F 7/002; G03F 7/165; G03F 7/40; G03F 7/32; H01L 21/0274; B82Y 10/00; B82Y 40/00
USPC ............. 430/270.1, 322, 325, 329, 330, 331
See application file for complete search history.

(56) References Cited

U.S. PATENT DOCUMENTS

| | | | |
|---|---|---|---|
| 6,989,324 B2 * | 1/2006 | Lee ........................ | B82Y 10/00 423/600 |
| 9,395,624 B2 * | 7/2016 | Jeong | |
| 9,574,104 B1 * | 2/2017 | Kim ........................ | G03F 7/40 |
| 2004/0126712 A1 * | 7/2004 | Kawamura ........... | C08F 292/00 430/322 |

(Continued)

FOREIGN PATENT DOCUMENTS

JP 2001-164428 6/2001

*Primary Examiner* — Amanda C Walke
(74) *Attorney, Agent, or Firm* — Knobbe Martens Olson & Bear LLP

(57) ABSTRACT

A method for producing a fiber having a pattern on a surface thereof, the method including forming a resin composition layer having a linear first pattern using a resin composition; and forming a second pattern on the resin composition layer. The second pattern may be formed by forming a thin film of a block copolymer comprising at least two block chains different from each other in surface free energy on the resin composition layer and subjecting the block copolymer to microphase separation. Alternatively, the second pattern is formed by adhering particles onto the resin composition layer.

20 Claims, 2 Drawing Sheets

(56) References Cited

U.S. PATENT DOCUMENTS

| | | | |
|---|---|---|---|
| 2011/0081777 A1* | 4/2011 | Yoon | H01L 21/0337 |
| | | | 438/674 |
| 2012/0217165 A1* | 8/2012 | Feng | C25D 5/022 |
| | | | 205/135 |
| 2016/0187782 A1* | 6/2016 | Hustad | H01L 21/0274 |
| | | | 438/703 |
| 2016/0238938 A1* | 8/2016 | Ban | C08F 293/00 |
| 2016/0357109 A1* | 12/2016 | Jain | G03F 7/405 |
| 2016/0357110 A1* | 12/2016 | Zhou | G03F 7/0397 |

* cited by examiner

METHOD FOR PRODUCING A FIBER HAVING A PATTERN ON A SURFACE THEREOF

This application claims priority to Japanese Patent Application No. 2015-113713, filed Jun. 4, 2015, the content of which is incorporated herein by reference.

BACKGROUND OF THE INVENTION

Field of the Invention

The present invention relates to a method for producing a fiber having a pattern on a surface thereof, and a fiber produced by the method.

Related Art

Studies on providing of concaves and convexes on the surface of a fiber have hitherto been made for attaining various purposes such as an improvement in touch feeling and texture. For example, Patent Document 1 proposes a method for producing a composite fiber having concaves and convexes on a surface thereof, the method comprises subjecting a polyester composition containing 20 to 50% by mass of a poly(meth)acrylate resin and a polyester free from a poly(meth)acrylate resin to composite spinning, taking off an unstretched yarn at a speed of not more than 3500 m/min; followed by stretching the unstretched yarn at a stretching temperature of 55 to 95° C. by a factor of 0.62 to 0.91 of the maximum stretch ratio.

On the other hand, extrafine fibers such as nanofibers having a thickness on a nanometer order have drawn attention, for example, from the viewpoints of a high level of absorptivity by virtue of a larger surface area, a reduction in pressure loss by virtue of the occurrence of a slip stream in filter applications, excellent optical properties that can easily provide highly transparent fabrics, and excellent electric characteristics, kinetic properties, and thermal properties derived from a supermolecule alignment effect.

Patent Document 1: Japanese Unexamined Patent Application, Publication No. 2001-164428

SUMMARY OF THE INVENTION

If concaves and convexes can be provided also on the surface of ultrafine fibers, for example, having a thickness on a nanometer scale to a thickness of several micrometers, a higher level of function can be expected, for example, by an increased surface area. However, satisfactory studies have not been made on a method for providing concaves and convexes on the surface of such ultrafine fibers.

The present invention has been made in view of the above problem, and an object of the present invention is to provide a method for producing a fiber having a pattern on a surface thereof, wherein, even when the fiber is an ultrafine fiber with a thickness on a nanometer scale to a thickness of several microns, a concavo-convex shape can be provided regularly in a uniform size onto the surface thereof.

The present inventors have found that the above problem can be solved by a method for producing a fiber, the method comprising the steps of: forming a resin composition layer having a linear first pattern using a resin composition; and forming a second pattern on the resin composition layer, which has led to the completion of the present invention.

According to a first aspect of the present invention, there is provided a method for producing a fiber having a pattern on a surface thereof, the method comprising:

forming a resin composition layer having a linear first pattern using a resin composition; and forming a second pattern on the resin composition layer.

According to a second aspect of the present invention, there is provided a fiber having a pattern on a surface thereof, the fiber being produced by the method according to the first aspect of the present invention.

The present invention can provide a method for producing a fiber having a pattern on a surface thereof, wherein, even if the fiber is an ultrafine fiber having a thickness on a nanometer scale to a thickness of several microns, a concavo-convex shape can be provided onto the surface thereof.

DETAILED DESCRIPTION OF THE PREFERRED EMBODIMENTS

<<Method for Producing Fiber>>

Figure 1A:
FIG. 1A is a schematic cross-sectional view of a substrate having a linearly patterned resin composition layer on a surface thereof.

In the method for producing a fiber according to the present invention, a fiber having a pattern on a surface thereof is produced. The method for producing a fiber according to the present invention comprises the steps of:

forming a resin composition layer having a linear first pattern using a resin composition; and forming a second pattern on the resin composition layer.

In the following detailed description of the invention, the step of forming a resin composition layer having a linear first pattern using a resin composition is referred to as a first step, and the step of forming a second pattern on the resin composition layer is referred to as a second step.

Essential or optional steps comprised in the method for producing a fiber according to the present invention are described hereinafter.

First Step

In the first step, a resin composition layer having a linear first pattern is formed using a resin composition. The resin composition layer 11 is generally supported by any support. For this reason, the resin composition layer 11 is preferably formed on a substrate 10.

The material for the substrate 10 is not particularly limited and may be appropriately selected depending, for example, upon methods for the formation of the resin composition layer 11. Materials for the substrate 10 include inorganic materials such as silicon and glass and organic materials such as resins, for example, polyethylene terephthalate.

The resin composition layer 11 having a linear first pattern may be formed on the substrate 10 by any method without particular limitation, and the method may be appropriately selected from well-known pattern forming methods. Preferred methods for the formation of the resin composition layer 11 having a linear first pattern include the following methods.

(1) A method of applying a photosensitive composition onto a substrate 10 to form a coating film that is processed by photolithography to obtain a linearly patterned first pattern.
(2) A photoimprinting method of applying a photosensitive composition onto a substrate 10 to form a coating film, pressing a pressing mold having a shape corresponding to a pattern shape of the resin composition layer 11 against the coating film, followed by exposing the coating film pressed by the pressing mold to light to cure the coating film and thus to obtain the resin composition layer 11.
(3) A thermal imprinting method of forming a thin film of a material having a glass transition temperature on a substrate 10, pressing a pressing mold having a shape corresponding to a pattern shape of a resin composition layer 11 against the thin film in such a state that the formed thin film has been heated at or above the glass transition temperature, thereby deforming the thin film, followed by cooling the deformed thin film to obtain the resin composition layer 11.
(4) A method of forming a thin film of an etchable resin on a substrate 10, followed by etching for linear pattern formation.

The resin composition layer 11 having a first pattern formed by using the photosensitive composition in the method (1) is not necessarily developed as long as exposure is carried out so that the layer 11 is linearly patterned. That is, the resin composition layer 11 may be a layer comprising linear pattern areas that are finally converted to fibers, and nonpattern areas that are removed by development. In the case of the resin composition layer 11 being a layer comprising linear pattern areas that are finally converted to fibers, and nonpattern areas that are removed by development, fibers of a second pattern can be formed on the surface of the substrate 10 by forming a second pattern on the whole area of the resin composition layer 11 and developing the resin composition layer 11.

In the thermal imprinting method employed in the method (3), materials usable for the thin film formation include, for example, (meth)acrylic resins typified by polymethyl methacrylate (PMMA), polycarbonate resins, polystyrenes, polyester resins such as polyethylene terephthalate, and thermoplastic resins such as cycloolefin resins.

As to the resin composition layer 11 formed by the above method or the like, the shape of the linear pattern is not particularly limited and may be either a linear or curved form.

The thickness of the resin composition layer 11 is not particularly limited and may be appropriately determined depending upon the thickness of the fiber to be formed. The thickness of the resin composition layer 11 is preferably, for example, 100 nm to 1000 μm, more preferably 1 μm to 500 μm.

The width of lines in the linear pattern corresponding to the width of fibers in a direction perpendicular to the thickness direction of the resin composition layer 11 may also be determined depending upon the thickness of the fiber to be formed. The width of lines of the linear pattern is preferably, for example, 100 nm to 1000 μm, more preferably 1 μm to 500 μm.

As described above, various materials may be used as the material for the resin composition layer 11. A photosensitive composition is preferably used, since a resin composition layer 11 having a linear pattern of which shape and dimension have been finely adjusted can easily be formed.

Photosensitive compositions are classified into positive-type photosensitive compositions that allow exposed areas to be solubilized with respect to developing solutions and negative-type photosensitive compositions that allow exposed areas to be insolubilized with respect to developing solutions. Both types can be used in the formation of the resin composition layer 11. Negative-type photosensitive compositions that are cured under exposure are preferred since the resin composition layer 11 having excellent strength can be formed.

Preferred examples of photosensitive compositions include compositions comprising an epoxy group-containing epoxy compound and a photosensitive curing agent, compositions comprising an alkali-soluble resin, a photopolymerizable compound containing an unsaturated double bond, and a photopolymerization agent, and compositions comprising an alkali-soluble resin such as polyhydroxystyrene (PHS), a crosslinking agent, and a photoacid generating agent. Among the above photosensitive compositions, compositions comprising an epoxy group-containing epoxy compound and a photosensitive curing agent and compositions comprising an alkali-soluble resin, a crosslinking agent, and a photo-acid generating agent are preferred from the viewpoint of the strength of the formed fiber.

Following the formation of the pattern on the surface, a sacrificing film (not shown) that is soluble in a solvent may be provided between the substrate 10 and the resin composition layer 11 from the viewpoint of easy separation of the fiber from the substrate 10. The fiber having a pattern on a surface thereof can easily be separated from the substrate 10 by dissolving the sacrificing film in a solvent.

The material used for sacrificing film formation is not particularly limited as long as the material allows the sacrificing film to be dissolved in the solvent to separate the fiber. A solution prepared by dissolving a solvent-soluble main agent in a solvent is preferably used as a coating liquid for sacrificing film formation.

Examples of main agents of the sacrificing film include polyvinyl alcohol resins, dextrins, gelatins, glues, caseins, shellacs, gum arabics, starches, proteins, polyacrylic acid amides, sodium polyacrylates, polyvinyl methyl ethers, styrenic elastomers, copolymers of methyl vinyl ether with maleic anhydride, copolymers of vinyl acetate with itaconic acid, polyvinyl pyrrolidones, acetylcelluloses, hydroxyethylcelluloses, and sodium alginate. These materials may be a combination of a plurality of materials soluble in an identical liquid. The coating liquid for the formation of the sacrificing film may contain a rubber component such as mannan, xanthan gum, and guar gum from the viewpoints of strength and flexibility of the sacrificing film.

A coating liquid for the formation of the sacrificing film is prepared by dissolving the above-described main agent of the sacrificing film in a solvent. The solvent for dissolving the main agent of the sacrificing film can be any liquid that neither deteriorates nor dissolves the formed fiber, with no particular limitation. Examples of the solvent for dissolving the main agent of the sacrificing film include water, acidic or basic aqueous solutions, organic solvents, and aqueous solutions of organic solvents. Among them, water, acidic or basic aqueous solutions, and aqueous solutions of organic solvents are preferred.

Preferred examples of the solvent for dissolving the main agent of the sacrificing film include an organic solvent. Organic solvents include lactone, ketone, polyhydric alcohol, cyclic ether, and ester organic solvents, aromatic organic solvents, alcohol solvents, terpene solvents, hydrocarbon solvents, and petroleum solvents. These organic solvents may be used solely or in a combination of a plurality of types thereof.

Lactone organic solvents include, for example, γ-butyrolactone, examples of ketone organic solvents include acetone, methyl ethyl ketone, cycloheptanone, cyclohexanone, methyl-n-pentyl ketone, methyl isopentyl ketone, or 2-heptanone, and examples of polyhydric alcohol organic solvents include ethylene glycol, diethylene glycol, propylene glycol, or dipropylene glycol.

The polyhydric alcohol organic solvent may be a polyhydric alcohol derivative, and examples thereof include compounds containing an ester bond (for example, ethylene glycol monoacetate, diethylene glycol monoacetate, propylene glycol monoacetate, or dipropylene glycol monoacetate), or compounds containing an ether bond (for example, monomethyl ether, monoethyl ether, monopropyl ether of the above polyhydric alcohols or the above ester bond-containing compounds, or monoalkyl ethers or monophenyl ethers of monbutyl ether and the like). Among them, propylene glycol monomethyl ether acetate (PGMEA), and propylene glycol monomethyl ether (PGME) are preferred.

Cyclic ether organic solvents include, for example, dioxane, and examples of ester organic solvents include methyl lactate, ethyl lactate (EL), methyl acetate, ethyl acetate, butyl acetate, methyl pyruvate, ethyl pyruvate, methyl methoxypropionate, or ethyl ethoxypropionate.

Aromatic organic solvents include, for example, anisole, ethyl benzyl ether, cresyl methyl ether, diphenyl ether, dibenzyl ether, phenetol, butyl phenyl ether, ethylbenzene, diethylbenzene, pentylbenzene, isopropylbenzene, toluene, xylene, cymene, or mesitylene.

The alcohol solvent is not particularly limited as long as the solvent can dissolve the main agent of the sacrificing film. Examples thereof include methanol and ethanol.

Terpene solvents include, for example, include geraniol, nerol, linalool, citral, citronellol, menthol, isomenthol, neomenthol, α-terpineol, β-terpineol, γ-terpineol, terpinen-1-ol, terpinen-4-ol, dihydroterpinyl acetate, 1,4-cineol, 1,8-cineol, borneol, carvone, ionone, thujone, and camphor.

Hydrocarbon solvents include straight chain, branched chain, or cyclic hydrocarbons. Such hydrocarbon solvents include, for example, straight chain hydrocarbons having 3 to 15 carbon atoms such as hexane, heptane, octane, nonane, decane, undecane, dodecane, and tridecane; branched hydrocarbons having 4 to 15 carbon atoms such as methyloctane; and cyclic hydrocarbons such as p-menthane, o-menthane, m-menthane, diphenylmenthane, 1,4-terpin, 1,8-terpin, bornane, norbornane, pinane, thujane, carane, longifolene, α-terpinene, β-terpinene, γ-terpinene, α-pinene, β-pinene, α-thujone, and β-thujone.

Petroleum solvents include, for example, cyclohexane, cycloheptane, cyclooctane, naphthalene, decahydronaphthalene (decalin), and tetrahydronaphthalene (tetralin).

The coating liquid for the formation of the sacrificing film is prepared by homogeneously dissolving the material for the sacrificing film and the solvent as described above.

The concentration of the coating liquid may be appropriately determined by taking into consideration the coatability of the coating liquid and the thickness of the sacrificing film. Following the formation of the sacrificing film, the solvent may, if necessary, be removed from the sacrificing film.

The thickness of the sacrificing film is not particularly limited; however is preferably 0.1 to 100 μm, more preferably 0.5 to 50 μm, particularly preferably 0.5 to 10 μm, from the viewpoint of rapidly dissolving the sacrificing film in the solvent.

Second Step

In the second step, a second pattern is formed on the resin composition layer 11. The second pattern may be formed by any method without particular limitation. Preferred methods include:

(I) A method of forming a thin film of a block copolymer composed of at least two block chain different from each other in surface free energy on the resin composition layer 11, followed by subjecting the block copolymer to microphase separation, and (II) A method of adhering particles onto the resin composition layer 11.

The methods (I) and (II) are described hereinafter with reference to FIG. 1A to FIG. 1C, FIG. 2A to FIG. 2C, and FIG. 3A to FIG. 3D.

(Method (I))

In the method (I), a thin film formed of a block copolymer composed of at least two block chain different from each other in surface free energy is formed on the resin composition layer 11, and the block copolymer is subjected to microphase separation.

At the outset, the microphase separation of the block copolymer will be described. In the case of mixing a plurality of homopolymers, in general, the homopolymers are hardly homogeneously mixed. Different homopolymers generally have mutually different surface free energy, thus are repulsive to each other, resulting in aggregation of the same type of homopolymer between molecules. This causes phase separation of different homopolymers. The same phase separation occurs also in the block copolymer. In the block copolymer, however, since block chains corresponding to the homopolymer are chemically bonded, the size of phase produced as a result of the separation is small. In this case, the size of the phase is substantially the same as the size of the block chain. Such a phase separation of the block copolymer is called microphase separation. The size of the phase region formed by the microphase separation is typically approximately several nanometers to 100 nanometers.

The shape of domains formed by the microphase separation greatly depends upon the degree of polymerization of the block copolymer, chemical properties of each block chain, and volume fraction of each block chain. In a diblock copolymer composed of a block chain A and a block chain B, when the volume fraction of the block A is changed from 0 to 0.5, the domain shape is changed to a random structure, a spherical structure, a cylinder structure, and a lamellar structure in that order. On the other hand, when the volume fraction of the block A is changed from 0.5 to 1.0, the domain shape is changed to a lamellar structure, a cylinder structure, a spherical structure, and a random structure in that order.

Block chains constituting the block copolymer is described hereafter. The block chain constituting the block copolymer may be appropriately selected from various polymer chains known in the prior art as long as microphase separation can occur. Preferred examples of preferred block chains include (meth)acrylate polymer chains, styrene derivative polymer chains, diene polymer chains, and polysiloxane chains.

Preferred examples of (meth)acrylate polymer chains include poly(methyl(meth)acrylate) chains, poly(ethyl (meth)acrylate) chains, poly(n-propyl(meth)acrylate) chains, poly(n-butyl(meth)acrylate chains, poly(isobutyl (meth)acrylate) chains, poly(tert-butyl(meth)acrylate) chains, poly(neopentyl(meth)acrylate) chains, poly(cyclohexyl(meth)acrylate) chains, poly(2-hydroxyethyl(meth) acrylate) chains, poly(2-hydroxypropyl(meth)acrylate), and poly(trifluoroethyl(meth)acrylate) chains.

Preferred examples of styrene derivative polymer chains include polystyrene chains, poly(α-methylstyrene) chains, poly(2-vinylpyridine) chains, poly(4-vinylpyridine) chains, poly(4-hydroxystyrene) chains, poly(tert-butylstyrene) chains, poly(tert-butoxystyrene) chains, poly(4-aminomethylstyrene) chains, poly(4-methoxystyrene) chains, and poly (p-chloromethylstyrene).

Preferred examples of diene polymer chains include poly (1,2 added butadiene) chains, poly(1,4 added butadiene) chains, poly(1,2 added isoprene) chains, poly(1,4 added isoprene) chains, poly(1,4 added hydrogenated isoprene) chains, and poly(isobutylene) chains.

Preferred examples of polysiloxane chains include poly (dimethylsiloxane) chains, poly(diphenylsiloxane) chains, and poly(methylphenylsiloxane) chains.

Preferred examples of block chains other than mentioned above include poly(ferrocenyldimethylsilane) chains, polyacrylonitrile chains, polyacrylamide, poly(N,N-dimethylacrylamide) chains, poly(ε-caprolactone) chains, poly(ethylene oxide) chains, poly(propylene oxide) chains, and poly(meth)acrylic acid chains.

The block copolymer may be, besides an A-B-type diblock copolymer, for example, an A-B-A-type triblock copolymer, and an A-B-C-type triblock copolymer. The volume fraction of each block chain is appropriately selected depending upon the shape of domains formed by the microphase separation.

The molecular weight of the block copolymer is described hereafter. In the case of the molecular weight of the block copolymer being approximately 100,000 g/mol, domains of about 50 nm pitches are formed by the microphase separation. Furthermore, in the case of the molecular weight of the block copolymer being not more than approximately 80,000 g/mol, domains of not more than 40 nm pitches can be formed by the phase separation. Furthermore, in the case of the molecular weight of the block copolymer being not more than approximately 40,000 g/mol, domains of not more than 30 nm pitches can be formed. When the molecular weight of the block copolymer is not more than approximately 20,000 g/mol, domains of not more than 20 nm pitches can be formed. The molecular weight of the block copolymer is a number average molecular weight as determined by molecular weight distribution measurement by size exclusion chromatography.

Figure 1B:
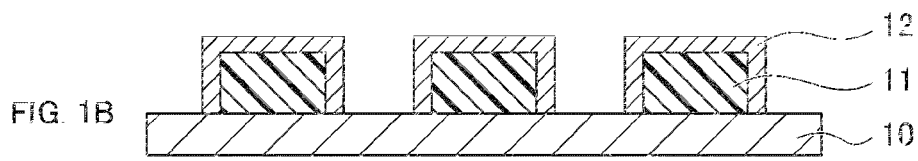
FIG. 1B is a schematic view of a block copolymer layer composed of at least two block chains respectively having different surface free energy, the layer being formed on a surface of a linearly patterned resin composition layer on a substrate.

As illustrated in FIG. 1A and FIG. 1B, the above described block copolymer solution is coated on the surface of the linearly patterned resin composition layer 11 to form a block copolymer layer 12. The solvent that dissolves the block copolymer is not particularly limited as long as the solvent satisfactorily dissolves the block copolymer. Preferred examples of solvents include toluene, benzene, chlorobenzene, ethylbenzene, o-dichlorobenzene, anisole, 2-methoxyethyl acetate, 2-ethoxyethyl acetate, diethylene glycol dimethyl ether, propylene glycol monomethyl ether acetate, tetrahydrofuran, 1,4-dioxane, acetone, methyl ethyl ketone, cyclohexane, cyclohexanone, chloroform, ethyl acetate, cyclohexyl acetate, ethanol, and isopropanol.

Methods for applying a block copolymer solution onto a surface of the resin composition layer 11 include, for example, methods using contact transfer-type coaters such as roll coaters, reverse coaters, and bar coaters and noncontact-type coaters such as spinners (rotary coaters) and curtain flow coaters.

The thickness of the block copolymer layer 12 is not particularly limited and may be appropriately determined by taking into consideration the thickness of the fiber formed and spacing between patters in the linear pattern in the resin composition layer 11. The thickness of the block copolymer layer 12 is preferably 1 to 1000 nm, more preferably 10 to 500 nm.

Figure 1C:
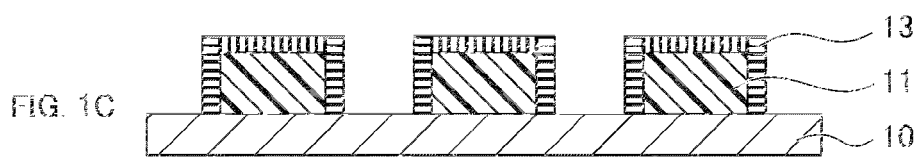
FIG. 1C is a schematic view of a block copolymer layer formed on a surface of a linearly patterned resin composition layer on a substrate, the block copolymer layer having been converted to a microphase separation layer by inducing microphase separation.

Microphase separation in the block copolymer layer 12 formed as illustrated in FIG. 1B is induced to form a microphase separation layer 13 on a surface of the resin composition layer 11 as illustrated in FIG. 1C.

Microphase separation is induced by heat-treating the block copolymer layer 12. After the induction, the block copolymer layer 12 is immediately cooled to form a microphase separation layer 13 having a microphase separation structure. Any heat treatment method may be employed with no particular limitation. For example, the heat treatment may be carried out with an oven or a hot plate. Preferably, the heat treatment is carried out in an inert gas atmosphere such as nitrogen or argon from the viewpoint of preventing an oxidative deterioration in the block copolymer layer 12. The heat treatment temperature is preferably a temperature between the glass transition temperature and the heat decomposition temperature of the block copolymer.

In the case of the microphase separation layer 13 having minute concaves and convexes, the linear resin composition contained in the resin composition layer 11 with the microphase separation layer 13 provided on the surface thereof as such is utilizable as fibers. On the other hand, in the case of the surface of the microphase separation layer 13 being free from concaves and convexes, at least one of a plurality of domains contained in the microphase separation layer 13 should be removed from the microphase separation layer 13. Removing methods include, for example, methods using etching.

In the case of the block copolymer being composed of two or more blocks different from each other in etching speed, etching of the microphase separation layer 13 allows domains etched at a higher speed to be preferentially removed while domains etched at a lower speed to remain unremoved. As a result, a periodic pattern reflecting the microphase separation structure is formed on the surface of the resin composition layer 11.

In general, aromatic ring-containing polymers, silicon atom-containing polymers, and polymers having a low oxygen atom content are known as polymers having a low dry etching speed. Specifically, the dry etching speed of styrene derivative polymer chains, diene polymer chains, and polysiloxane chains are low. On the other hand, examples of block chains having a dry etching speed include (meth) acrylate chains.

Etching methods include physical dry etching by a sputtering phenomenon utilizing an inert and reactive ion etching (RIE) using oxygen, chlorine, fluorine and other reactive gases. Further, plasma by electronic cyclotron resonance (ECR) and plasma by inductive coupling (ICP). Etching gases include Ar, $H_2$, $N_2$, $O_2$, CO, $CO_2$, $CF_4$, $CHF_3$, $CH_2F_2$, $C_2F_6$, $C_3F_6$, $C_4F_8$, $NH_3$, $Cl_2$, $BCl_3$, $SF_6$ and the like that may be used solely or as a mixture.

Other methods that selectively remove specific domains in the microphase separation layer 13 include methods using a block copolymer containing photosensitive block chains. After the microphase separation of the block copolymer, exposure or exposure/development is carried out to selectively remove only photosensitive block chains.

Photosensitive block chains are preferably those that are decomposed under radiation irradiation. Domains of block chains that are decomposed under radiation irradiation are decomposed and removed from the microphase separation layer 13 only by the radiation irradiation. Radiation to be applied includes ultraviolet light, X rays, electronic beams, and ion beams.

Block chains that are decomposed under radiation irradiation include poly(methyl methacrylate) chains, poly(α-chloro acrylate) chains, poly(n-butyl methacrylate) chains, poly(fluorobutyl methacrylate) chains, poly(glycidyl methacrylate) chains, poly(butene-1-sulfone) chains, and poly(styrenesulfone) chains.

The fiber that is formed on the substrate 10 and includes a linear resin composition in a resin composition layer 11 and a second pattern derived from a microphase separation layer 13 is if necessary separated from the substrate and is used for various applications.

(Method (II))

In the method (II), particles 14 are adhered onto the resin composition layer 11 to form a second pattern. The material for particles 14 and the particle diameter are not particularly limited as long as the particles 14 can be adhered onto the surface of the resin composition layer 11.

The material for particles 14 may be either organic materials or inorganic materials. Particles 14 comprising organic materials composited with inorganic materials may also be used. Furthermore, the shape of the particles 14 is also not particularly limited. Shapes of the particles 14 include, for example, spherical shapes, oval spherical shapes, cylindrical shapes, prismatic shapes, and flaky shapes. The particles 14 may also be empty. Empty particles and microcapsules with various chemical agents included therein may also be used as the particles 14.

Preferred materials for the particles 14 include inorganic materials such as silver, gold, silica, SiC, $Al_2O_3$, copper oxide, iron oxide, cobalt oxide, titanium oxide, TiC, zirconium oxide, cerium oxide, ITO, and hydroxyapatite, and crosslinked polystyrene, crosslinked methyl methacrylate, graphene, graphene oxide, fullerene, diamond, and other carbon-containing materials.

The diameter of the particles is not particularly limited as long as the particle diameter is small enough to be adhered to the surface of the fiber. The particle diameter of the particles is preferably 1 to 10000 nm, more preferably 50 to 3000 nm, in terms of volume average particle diameter.

The method for adhering the particles 14 to the surface of the resin composition layer 11 is not particularly limited. Preferred methods include:

(II-1) A method of scattering particles 14 onto the surface of the resin composition layer 11 by coating a suspension containing the particles 14 onto the surface of the resin composition layer 11 (hereinafter referred to also as scattering method), and (II-2) A method of laminating a film 15 bearing particles 14 onto the surface of the resin composition layer 11 and the particles 14 are transferred from the film 15 to the surface of the resin composition layer 11 (hereinafter referred to also as "transfer method").

Figure 2A:
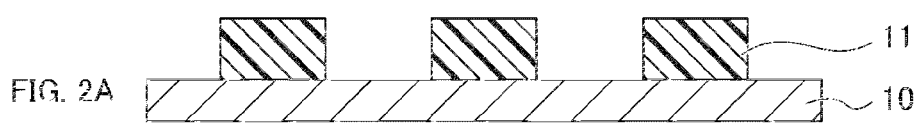
FIG. 2A is a schematic cross-sectional view of a substrate including a linearly patterned resin composition layer on a surface thereof.
Figure 2B:
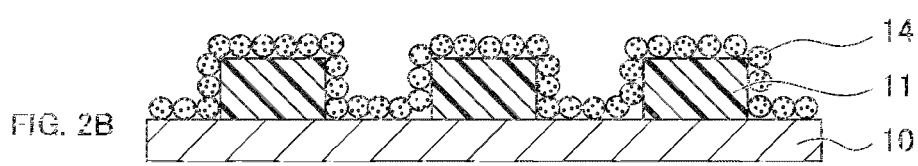
FIG. 2B is a schematic view of particles being adhered to the surface of a substrate and to the surface of a linearly patterned resin composition layer.

In the scattering method, a suspension containing particles 14 is coated onto the surface of the resin composition layer 11 to adhere particles 14 onto the substrate 10 and the surface of the resin composition layer 11 as illustrated in FIG. 2B. The solid content concentration of the suspension is not particularly limited as long as the suspension can be applied onto the surface of the resin composition layer 11. A dispersion medium contained in the suspension is not particularly limited as long as the dispersion medium does not dissolve the particles 14 and the resin composition layer 11. The type of the dispersion medium may be appropriately selected according to the material for the particles 14 and the resin composition layer 11.

Methods for applying a suspension containing particles 14 onto the surface of the resin composition layer 11 include, for example, methods using contact transfer-type coaters such as roll coaters, reverse coaters, and bar coaters and noncontact-type coaters such as spinners (rotary coaters) and curtain flow coaters.

Following adherence of the particles 14 on the surface of the resin composition layer 11 by coating, if necessary, the resin composition layer 11 may be heated. In the case of the material for the resin composition layer 11 having a glass transition point, preferably, the resin composition layer 11 is heated to the glass transition temperature or above. In this case, since the resin composition layer 11 is softened, the particles 14 are likely to be strongly adhered to the surface of the resin composition layer 11.

Figure 2C:
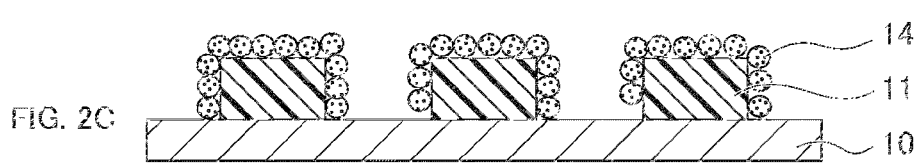
FIG. 2C is a schematic view of a state in which particles adhered to the surface of the substrate have been removed, while particles adhered to the surface of the linearly patterned resin composition layer are retained.

Following application of the suspension containing particles 14 onto the surface of the resin composition layer 11, if necessary, the dispersion medium may be removed by drying. Subsequently, by rinsing the surface of the substrate 10 and the resin composition layer 11, particles 14 remaining unadhered to the surface to the resin composition layer 11 are removed as illustrated in FIG. 2C.

Figure 3A:
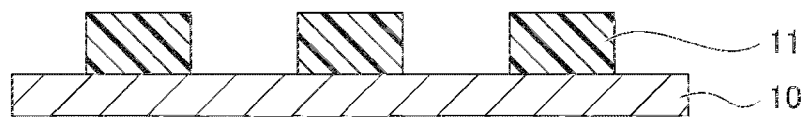
FIG. 3A is a schematic cross-sectional view of a substrate having a linearly patterned resin composition layer on a surface thereof.
Figure 3B:
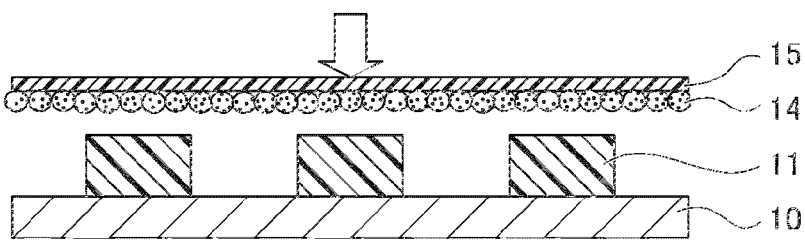
FIG. 3B is a schematic view illustrating a procedure of laminating a particle-bearing film onto a linearly patterned resin composition layer on a substrate.
Figure 3C:
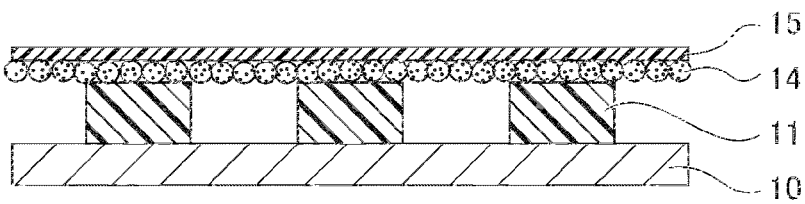
FIG. 3C is a schematic view of the particle-bearing film having been laminated onto the linearly patterned resin composition on the substrate.
Figure 3D:
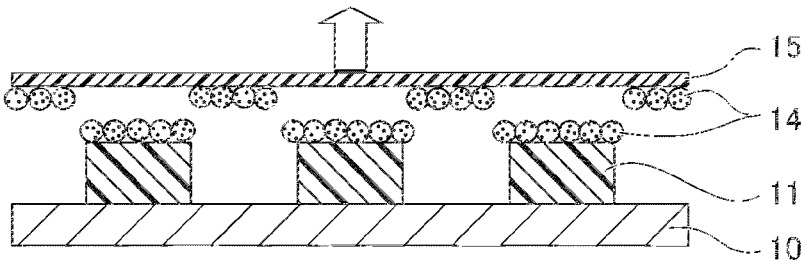
FIG. 3D is a schematic view illustrating a procedure of transferring particles to the surface of the resin composition layer by separating the particle-bearing film from the resin composition layer.

In the lamination method, as illustrated in FIGS. 3B and 3C, the film 15 bearing the particles 14 is laminated onto the surface of the resin composition layer 11, and, as illustrated in FIG. 3D, the film 15 is separated from the resin composition layer 11 to transfer the particles 14 from the film 15 to the surface of the resin composition layer 11.

The material for the film 15 is not particularly limited; however is preferably a resin material from the viewpoints of flexibility and easy lamination. The method for supporting the particles 14 on the surface of the film 15 is not particularly limited. For example, the particles 14 may also be supported on the surface of the film 15 through electrostatic action. When the film 15 has a weak tackiness, the particles 14 may be supported on the film 15 by the tackiness. In this case, a low-tack pressure-sensitive adhesive having a tackiness low enough to allow the particles 14 to be transferred from the surface of the film 15 to the surface of the resin composition layer 11 may be coated onto the surface of the film 15.

The particles 14 are contact-bonded to the surface of the resin composition layer 11 by laminating the film 15 bearing the particles onto the surface of the resin composition layer 11. Therefore, as illustrated in FIG. 3D, when the film 15 is separated from the resin composition layer 11, the particles that have been contact-bonded to the surface of the resin composition layer 11 are separated from the film and the particles are transferred from the film 15 onto the surface of the resin composition layer 11.

In the case of adhering the particles 14 to the resin composition layer 11 formed by using a negative-type photosensitive composition curable by exposure, the resin composition layer 11 is preferably a layer that includes linear pattern areas that are finally converted to fibers, and nonpattern areas that are removed by development. Following the lamination of the film 15 bearing the particles onto the resin composition layer 11, the resin composition layer 11 is subjected to post exposure bake (PEB). Consequently, particles 14 are strongly immobilized on the surface of the resin composition layer 11. Subsequent development removes nonpattern areas and the particles 14 adhered onto the surface thereof.

In the case of adhering the particles 14 to the resin composition layer 11 formed by using a positive-type photosensitive composition that is solubilized with respect to a developing solution by exposure, the resin composition layer 11 preferably consists of linear pattern areas only. In this case, the film 15 supporting the particles 14 is preferably laminated on the surface of the resin composition layer 11 under heating. In the case of lamination under heating, the material for the resin composition layer 11 is preferably tacky under heating conditions. Typically, the material for the resin composition layer 11 preferably has a glass transition point no higher than the heating temperature. The lamination described above strongly immobilizes the particles on the surface of the resin composition layer 11.

The method (II) provides a fiber having a pattern on a surface thereof, by forming a second pattern formed of the particles 14 on the surface of the linear resin composition contained in the resin composition layer 11. The fiber that is formed on the substrate 10 and includes a linear resin composition in the resin composition layer 11 and a second pattern formed of particles 14 is, if necessary, separated from the substrate and is used for various applications.

(Other Methods)

A thermal imprinting method may be mentioned as a method for the formation of a second pattern other than the above-described method (I) and method (II). In this method, in the case of the resin composition layer being formed of a material having a glass transition point, a pressing mold having a concave-convex pattern corresponding to a shape of a second pattern is pressed against the surface of the resin composition layer 11 heated to the glass transition temperature or the like followed by cooling of the resin composition layer 11 to form a second pattern on the surface of the resin composition layer 11.

Third Step

In the third step, the fiber formed on the substrate 10 is separated from the substrate 10. The method for separating the fiber is not particularly limited, and the fiber may be physically separated by applying external force to the fiber. Furthermore, as described above, when a sacrificing film is formed on the surface of the substrate 10, the fiber can be separated from the substrate 10 by dissolving the sacrificing film in a solvent. The above solvents used in the preparation of the coating liquid for sacrificing film formation may be mentioned as solvents used in the dissolution of the sacrificing film.

The method for bringing the sacrificing film into contact with the solvent to dissolve the adhesive layer is not particularly limited. A method of immersing the substrate 10 including a fiber in a container filled with a solvent.

According to the method described above, fibers with a thickness on nanometer scale to a thickness of several micrometers can be manufactured, and, even with ultrafine fibers, concave-convex shapes can be provided on the surface thereof. Fibers having a pattern on the surface thereof and produced by the above methods have a larger surface area than fibers free from a pattern on the surface thereof, and thus, high adsorptivity can be expected for nonwoven fabrics and the like produced therewith. Furthermore, since the surface area is large, for example, when treating the surface of the fibers with a treatment solution containing a chemical agent such as an antimicrobial agent, a larger amount of a chemical agent can be held on the surface of the fibers.

EXAMPLES

The following Examples further illustrate the present invention, though the present invention is not limited thereto.

Example 1

A photosensitive composition (TMMR S2000, manufactured by Tokyo Ohka Kogyo Co., Ltd.) was applied onto a silicon substrate, and the coated substrate was exposed and developed to form, as a resin composition layer, a line-and-space pattern having linear line areas that has a rectangular section and the size of 40 μm in width and 30 μm in height. A block copolymer solution prepared by dissolving a block copolymer composed of polystyrene block chains (number average molecular weight 18000) and poly(methyl methacrylate) chains (number average molecular weight 18000) in propylene glycol monomethyl ether acetate was coated on a surface of the resin composition layer to form a block copolymer layer having a thickness of 20 nm. The substrate including a block copolymer layer is annealed at 240° C. for one minute for microphase separation to form a microphase separation layer. The microphase separation layer thus formed is subjected to oxygen plasma etching to remove domains of poly(methyl methacrylate) chains and thus to form a pattern of domains of polystyrene block chains on the surface of linear line areas in the resin composition layer. The surface of the fiber including linear line areas in the resin composition and domains of polystyrene block chains were observed by a microscope, and a random curved pattern having been formed comprising lines and spacings arranged at intervals of about 14 nm was confirmed.

Example 2

A photosensitive composition (TMMR S2000, manufactured by Tokyo Ohka Kogyo Co., Ltd.) was applied onto a silicon substrate, followed by exposing the coated substrate through a line-and-space mask having a width of 40 μm to form a coating film having a thickness of 30 μm (a resin composition layer). A PET film bearing silica particles was laminated on the surface of the formed resin composition layer at 80° C. to adhere silica particles onto the surface of the resin composition layer, followed by baking at 90° C. for 5 min. After separating the PET film, dip development was carried out by using propylene glycol monomethyl ether acetate as a developing solution. The resin composition layer after the adherence treatment was observed by a microscope, and particles were confirmed to be densely adhered as a single layer only on the surface of the line areas.

EXPLANATION OF REFERENCE NUMERALS

10 Substrate
11 Resin composition layer
12 Block copolymer layer
13 Microphase separation layer
14 Particles
15 Film

What is claimed is:

1. A method for producing a fiber having a pattern on a surface thereof, the method comprising:
   forming a first linearly patterned resin composition layer on a substrate using a resin composition;
   forming a second patterned layer on the resin composition layer; and
   separating from the substrate a fiber which includes a linear resin composition in the resin composition layer, and the second patterned layer.

2. The method according to claim 1, wherein the resin composition is a photosensitive composition.

3. The method according to claim 2, wherein the photosensitive composition is a negative-type photosensitive composition.

4. The method according to claim 1, wherein the second patterned layer is formed by forming a thin film formed of a block copolymer comprising at least two block chains different from each other in surface free energy on the resin composition layer, and subjecting the block copolymer to microphase separation.

5. The method according to claim 1, wherein the second patterned layer is formed by adhering particles onto the resin composition layer.

6. A fiber having a pattern on a surface thereof, wherein the fiber consists essentially of a linear resin composition, and a patterned layer on the linear resin composition, and
   the patterned layer is a microphase separation layer formed from a block copolymer comprising at least two block chains different from each other in surface free energy, or particles.

7. A method for producing a fiber having a pattern on a surface thereof, the method comprising:
   forming a first linearly patterned resin composition layer using a resin composition; and
   forming a second patterned layer on the first linearly patterned resin composition layer by laminating a film having particles onto the resin composition layer, and transferring and adhering the particles from the film onto a surface of the resin composition layer.

8. A method for producing a fiber having a pattern on a surface thereof, the method comprising:
   forming a first linearly patterned resin composition layer using a resin composition; and
   forming a second patterned layer on the first linearly patterned resin composition layer by adhering silica particles onto the resin composition layer.

9. The method according to claim 5, wherein the second patterned layer is formed by laminating a film having particles onto the resin composition layer, and transferring and adhering the particles from the film onto a surface of the resin composition layer.

10. The method according to claim 8, wherein the second patterned layer is formed by laminating a film having particles onto the resin composition layer, and transferring and adhering the particles from the film onto a surface of the resin composition layer.

11. The method according to claim 7, wherein the first linearly patterned resin composition layer is formed on a substrate, and the method further comprises separating from the substrate a fiber which includes a linear resin composition in the resin composition layer, and the second patterned layer.

12. The method according to claim 8, wherein the first linearly patterned resin composition layer is formed on a substrate, and the method further comprises separating from the substrate a fiber which includes a linear resin composition in the resin composition layer, and the second patterned layer.

13. The method according to claim 1, wherein a thickness of the resin composition layer is 1 μm to 1000 μm.

14. The method according to claim 7, wherein a thickness of the resin composition layer is 1 μm to 1000 μm.

15. The method according to claim 8, wherein a thickness of the resin composition layer is 1 μm to 1000 μm.

16. A method according to claim 1, wherein a line width of a linear pattern of the resin composition layer is 1 μm to 1000 μm.

17. The method according to claim 7, wherein a line width of a linear pattern of the resin composition layer is 1 μm to 1000 μm.

18. The method according to claim 8, wherein a line width of a linear pattern of the resin composition layer is 1 μm to 1000 μm.

19. The fiber according to claim 6, wherein a line width of the linear resin composition is 1 μm to 1000 μm, and a thickness of the linear resin composition is 1 μm to 1000 μm.

20. The method according to claim 1, wherein the first linearly patterned resin composition layer is formed a method selected from the group consisting of methods (1) to (4) below:
   (1) applying a photosensitive composition onto the substrate to form a coating film and processing the formed coating film by photolithography to obtain a linearly patterned first layer;
   (2) applying a photosensitive composition onto a substrate to form a coating film, pressing a pressing mold having a shape corresponding to a pattern shape of the resin composition layer against the coating film, followed by exposing the coating film pressed by the pressing mold to light to cure the coating film and thus to obtain the resin composition layer;
   (3) forming a thin film of a material having a glass transition temperature on the substrate, pressing a pressing mold having a shape corresponding to a pattern shape of the resin composition layer against the thin film in such a state that the formed thin film has been heated at or above the glass transition temperature, thereby deforming the thin film, followed by cooling the deformed thin film to obtain the resin composition layer; and
   (4) forming a thin film of an etchable resin on the substrate, followed by etching the thin film for linear pattern formation.

* * * * *